US010998321B1

(12) United States Patent
Yeh

(10) Patent No.: US 10,998,321 B1
(45) Date of Patent: May 4, 2021

(54) SEMICONDUCTOR DEVICE HAVING A STACKED NANOWIRE STRUCTURE DISPOSED OVER A BURIED WORD LINE AND METHOD OF MANUFACTURING THE SAME

(71) Applicant: NANYA TECHNOLOGY CORPORATION, New Taipei (TW)

(72) Inventor: Huan-Yung Yeh, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/665,451

(22) Filed: Oct. 28, 2019

(51) Int. Cl.
*H01L 27/108* (2006.01)
*H01L 29/06* (2006.01)
*H01L 29/423* (2006.01)

(52) U.S. Cl.
CPC .... *H01L 27/10829* (2013.01); *H01L 27/1087* (2013.01); *H01L 27/10805* (2013.01); *H01L 27/10855* (2013.01); *H01L 27/10873* (2013.01); *H01L 27/10888* (2013.01); *H01L 27/10891* (2013.01); *H01L 29/0673* (2013.01); *H01L 29/42392* (2013.01)

(58) Field of Classification Search
CPC .......... H01L 27/10805–10841; H01L 27/10847–10891; H01L 27/10823; H01L 27/10826; H01L 27/1085–10855; H01L 27/10873–10879; H01L 27/10882–10891; H01L 27/10891; H01L 27/10876; H01L 27/10879
See application file for complete search history.

(56) References Cited

U.S. PATENT DOCUMENTS 6,207,985 B1 * 3/2001 Walker .............. H01L 27/10823
257/296
9,466,615 B2 * 10/2016 Miyairi ............. H01L 27/10873
(Continued)

FOREIGN PATENT DOCUMENTS

TW 201727874 A 8/2017
TW 201804602 A 2/2018

OTHER PUBLICATIONS

Office Action dated Nov 11, 2020 related to Taiwanese Application No. 109121396.

*Primary Examiner* — Younes Boulghassoul
(74) *Attorney, Agent, or Firm* — Muncy, Geissler, Olds & Lowe, P.C.

(57) ABSTRACT

A semiconductor device includes a buried word line in a substrate and extending along a first direction, a stacked nanowire structure over the buried word line, a first source/drain region and a second source/drain region on opposite sides of the stacked nanowire structure, and a bit line contact and a capacitor contact over the first source/drain region and the second source/drain region, respectively. A method for manufacturing the semiconductor device includes the steps of forming a buried word line extending along a first direction in a substrate, mounting an epitaxy silicon sheet on the substrate and the buried word line, forming a stacked nanowire structure over the buried word line, forming a first source/drain region and a second source/drain region on opposite sides of the stacked nanowire structure, and forming a bit line contact and a capacitor contact over the first source/drain region and the second source/drain region, respectively.

20 Claims, 5 Drawing Sheets

(56) References Cited

U.S. PATENT DOCUMENTS

| | | | |
|---|---|---|---|
| 10,079,234 B1* | 9/2018 | Leobandung | H01L 27/108 |
| 2006/0244024 A1* | 11/2006 | Manger | H01L 27/10891 |
| | | | 257/296 |
| 2010/0059807 A1* | 3/2010 | Cho | H01L 29/785 |
| | | | 257/306 |
| 2015/0333059 A1* | 11/2015 | Lee | H01L 27/10876 |
| | | | 257/334 |
| 2015/0364366 A1* | 12/2015 | Kim | H01L 27/10814 |
| | | | 438/396 |
| 2019/0043864 A1* | 2/2019 | Takesako | H01L 27/10891 |
| 2019/0237467 A1* | 8/2019 | Kim | H01L 27/10814 |
| 2020/0194435 A1* | 6/2020 | Lilak | H01L 29/1037 |
| 2020/0411520 A1* | 12/2020 | Lajoie | H01L 27/10805 |
| 2020/0411525 A1* | 12/2020 | Lajoie | H01L 27/124 |

* cited by examiner

SEMICONDUCTOR DEVICE HAVING A STACKED NANOWIRE STRUCTURE DISPOSED OVER A BURIED WORD LINE AND METHOD OF MANUFACTURING THE SAME

TECHNICAL FIELD

The present disclosure relates to a semiconductor device and a method for manufacturing the same, and more particularly, to a semiconductor device with reduced parasitic capacitance, and a method for manufacturing the same.

DISCUSSION OF THE BACKGROUND

The semiconductor integrated circuit (IC) industry has undergone a period of rapid development. Technological advances in integrated circuit materials and designs have produced many generations of integrated circuits. Each generation of integrated circuits has smaller and more complex circuits than previous generations of integrated circuits.

As the dimensions of modern integrated circuitry in semiconductor chips continue to shrink, conventional semiconductor processing is increasingly challenged to make structures of smaller and smaller dimensions. Not only is the circuit density increasing, but the performance of the devices needs to remain high. The goals of high performance and high-density conflict when the higher density causes undesired interactions between circuit elements. For example, as contact stubs and trenches are positioned closer and closer to the gate structure, parasitic capacitance and gate to source/drain coupling are increased, thus degrading performance.

Therefore, in this technical field, a semiconductor device with reduced parasitic capacitance and high performance and a method for manufacturing the same is needed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One embodiment of the present disclosure provides a semiconductor device. The semiconductor device includes a substrate, a buried word line disposed in the substrate and extending along a first direction, a stacked nanowire structure disposed over the buried word line, a first source/drain region and a second source/drain region disposed on opposite sides of the stacked nanowire structure, and a bit line contact and a capacitor contact disposed over the first source/drain region and the second source/drain region, respectively.

In some embodiments, the buried word line comprises an insulating liner and a conductive layer.

In some embodiments, a vertical distance between the bit line contact and the buried word line is substantially equal to or greater than a thickness of the stacked nanowire structure.

In some embodiments, a bottom surface of the bit line contact is at a higher level than a top surface of the buried word line.

In some embodiments, a vertical distance between the capacitor contact and the buried word line is substantially equal to or greater than a thickness of the stacked nanowire structure.

In some embodiments, a bottom surface of the capacitor contact is disposed at a higher level than a top surface of the buried word line.

The semiconductor device of claim 1, further comprising a bit line, disposed on the bit line contact and extending along a second direction, wherein the second direction is different from the first direction.

The semiconductor device of claim 1, further comprising a capacitor electrically connected to the capacitor contact.

In some embodiments, the stacked nanowire structure comprises a plurality of nanowires alternately stacked in a direction perpendicular to a top surface of the substrate.

In some embodiments, the semiconductor device further comprises a gate dielectric layer around each of the plurality of nanowires; and a gate electrode material around the gate dielectric layer.

One embodiment of the present disclosure also provides a method for manufacturing a semiconductor device. The method includes providing a substrate, forming a buried word line extending along a first direction in the substrate, mounting an epitaxy silicon sheet on the substrate and the buried word line, forming a stacked nanowire structure in the epitaxy silicon sheet and over the buried word line, forming a first source/drain region and a second source/drain region on opposite sides of the stacked nanowire structure, and forming a bit line contact and a capacitor contact over the first source/drain region and the second source/drain region, respectively.

In some embodiments, forming the buried word line extending along the first direction in the substrate comprises: forming an insulating liner over a trench in the substrate; forming a conductive layer over the insulating liner; and etching the insulating and the conductive layer until a portion of the sidewalls of the trench is exposed.

In some embodiments, a vertical distance between the bit line contact and the buried word line is substantially equal to or greater than a thickness of the stacked nanowire structure.

In some embodiments, forming the bit line contact and the capacitor contact over the first source/drain region and the second source/drain region comprises forming the bit line contact with a bottom surface at a higher level than a top surface of the buried word line.

In some embodiments, a vertical distance between the capacitor contact and the buried word line is substantially equal to or greater than a thickness of the stacked nanowire structure.

In some embodiments, forming the bit line contact and the capacitor contact over the first source/drain region and the second source/drain region comprises forming the capacitor contact with a bottom surface at a higher level than a top surface of the buried word line.

In some embodiments, the method further comprises: forming a bit line extending along a second direction on the bit line contact, wherein the second direction is different from the first direction.

In some embodiments, the method further comprises: forming a capacitor electrically connected to the capacitor contact.

In some embodiments, forming the stacked nanowire structure in the epitaxy silicon sheet and over the buried word line comprises forming a plurality of nanowires alternately stacked in a direction perpendicular to a top surface of the substrate.

In some embodiments, after forming a stacked nanowire structure in the epitaxy silicon sheet and over the buried word line, the method further comprises: forming a gate dielectric layer around each of the plurality of nanowires; and forming a gate electrode material around the gate dielectric layer.

In the present disclosure, the buried word line and the bit line contact (BC)/capacitor contact (CC) are disposed at different vertical levels, reducing the parasitic capacitance by the increased distance. Therefore, the performance of the semiconductor device in the embodiments of the present disclosure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
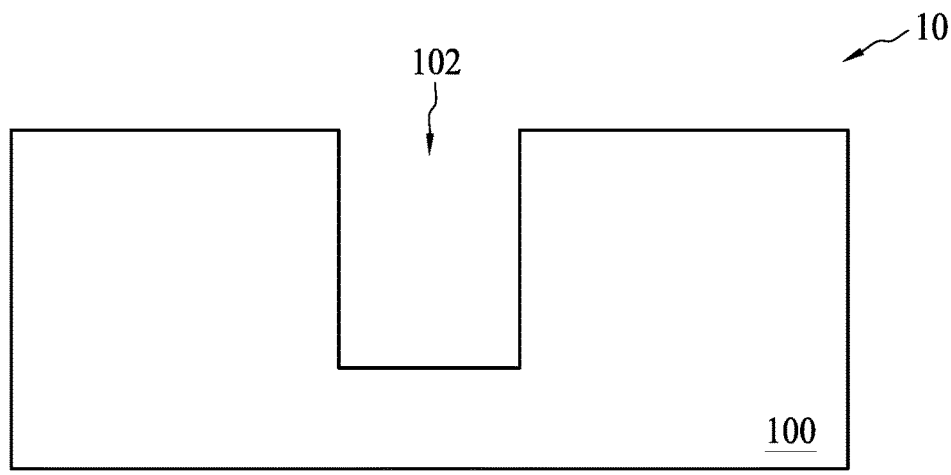
FIG. 1 illustrates a cross-sectional view of a semiconductor device at a fabrication stage during the manufacturing process in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The following describes some embodiments of the present disclosure. FIG. 1 to FIG. 9 are schematic cross-sectional views of a semiconductor device 10 during various stages in the manufacturing process according to some embodiments of the present disclosure. Additional operations can be provided before, during, and/or after the stages described in FIG. 1 to FIG. 9. In various embodiments, some of the foregoing operations may be moved, deleted, or replaced. Additional features can be added to the semiconductor device. In different embodiments, some of the features described below may be moved, deleted, or replaced.

Figure 9:
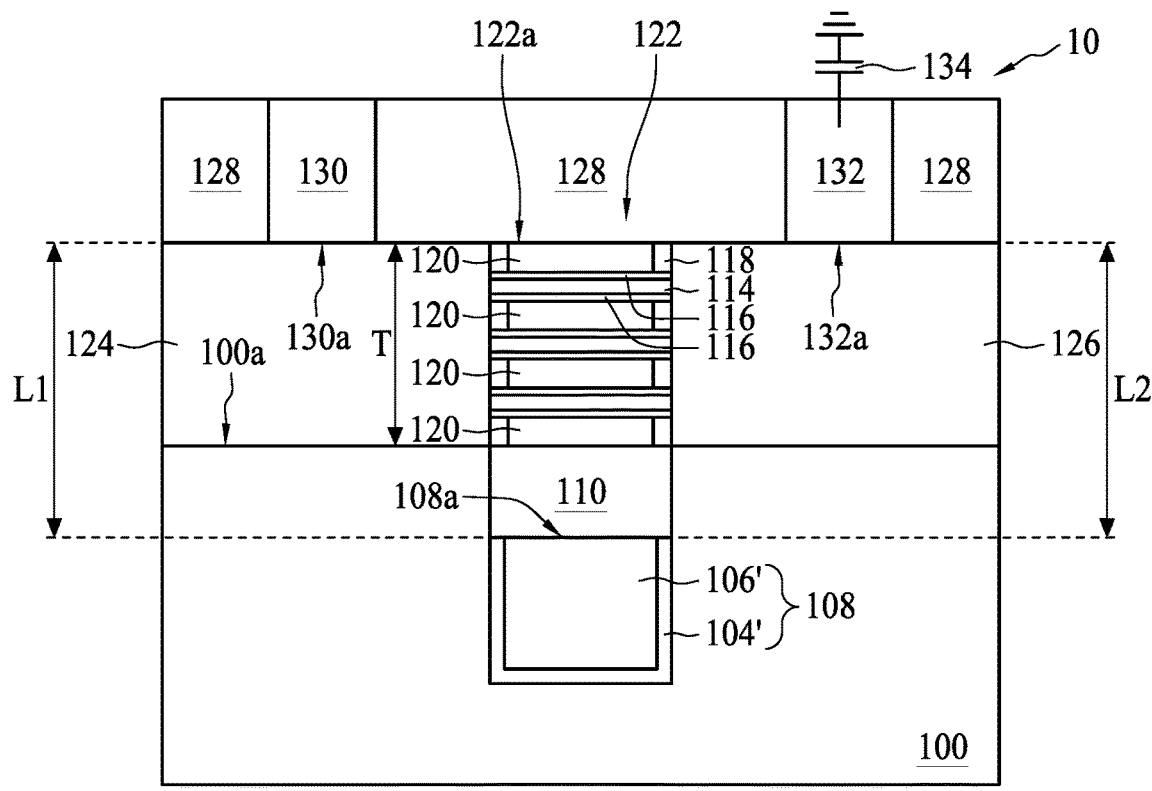
FIG. 9 illustrates a cross-sectional view of a semiconductor device at a fabrication stage during the manufacturing process in accordance with some embodiments of the present disclosure.
Figure 10:
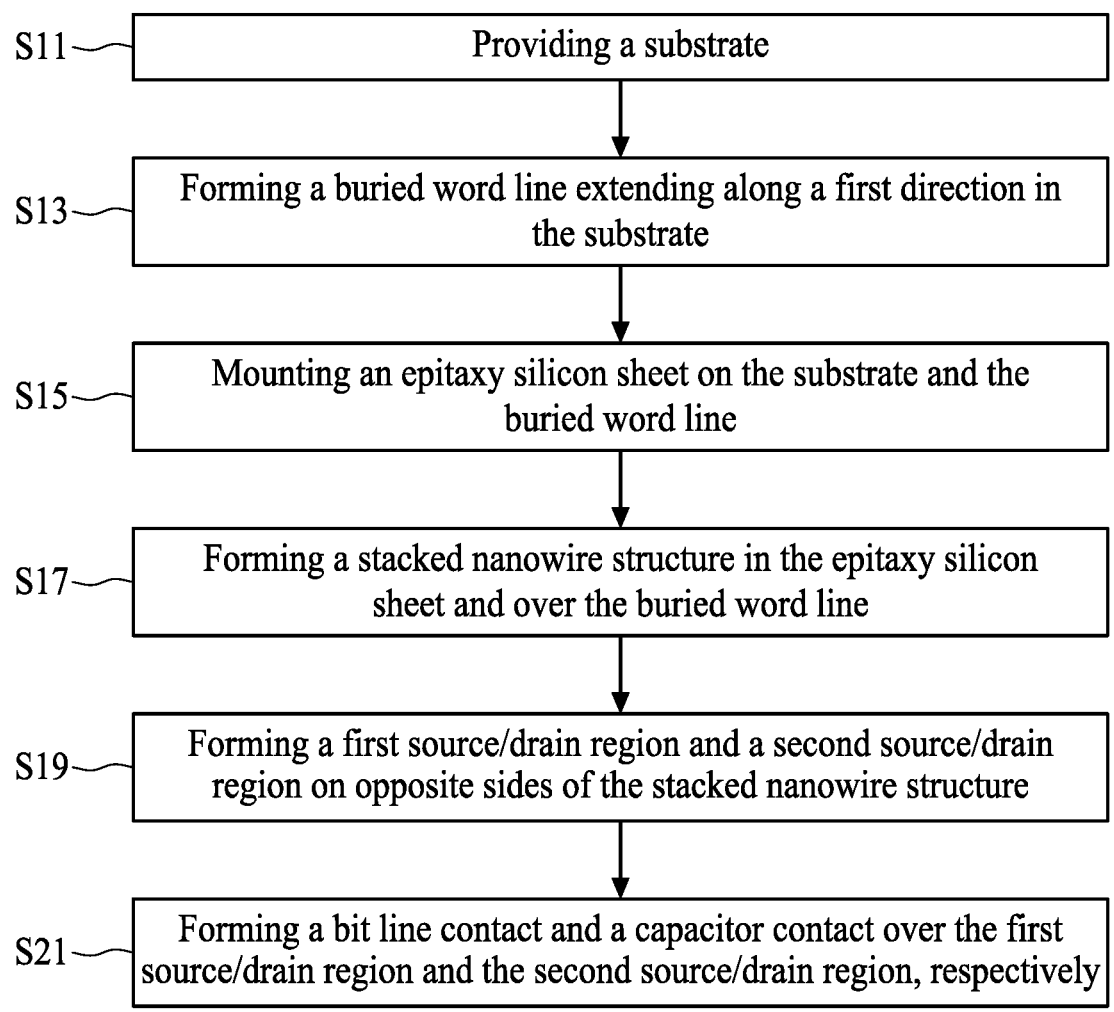
FIG. 10 illustrates a flowchart of an exemplary method for manufacturing a semiconductor device.

FIG. 10 illustrates a flowchart of an exemplary method 200 for manufacturing a semiconductor device 10 from step S11 to step S21. The method 200 is discussed in detail below, with reference to a semiconductor device shown in FIG. 1 to FIG. 9 for the sake of example.

Referring to FIG. 1 and FIG. 10, the method 200 begins at step S11, in which a substrate 100 is provided. In some embodiments, the substrate 100 may be a bulk semiconductor substrate, such as a semiconductor wafer. For example, the substrate 100 is a silicon wafer. The substrate 100 may include silicon or other elemental semiconductor materials, such as germanium. In some other embodiments, the semiconductor substrate 100 may include a compound semiconductor. The compound semiconductor may include gallium arsenide, silicon carbide, indium arsenide, indium phosphide, another suitable compound semiconductor, or a combination thereof.

In another embodiment, the substrate 100 may also include a silicon on insulator (SOI). The SOI substrate may be formed using a separation by implanted oxygen (SIMOX) process, a wafer bonding process, other applicable methods, or a combination thereof.

Referring to FIG. 10, the method 200 proceeds to step S13, in which a buried word line 108 is formed so as to extend along a first direction in the substrate 100. As shown in FIG. 1, a trench 102 may be formed in the substrate 100. In some embodiments, the trench 102 may be formed using, for example, one or more lithography patterning and etching processes. It should be understood that the size, shape, and location of the trench 102 shown in FIG. 1 are only illustrative and are not intended to limit the present disclosure.

Figure 2:
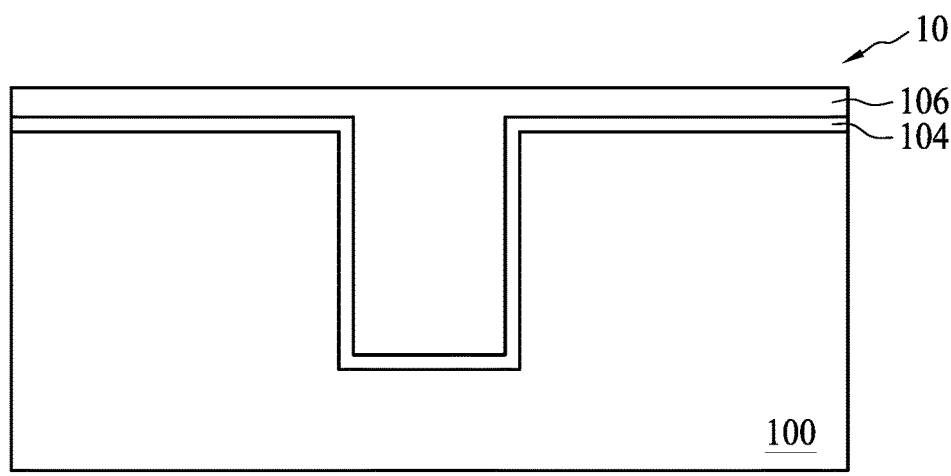
FIG. 2 illustrates a cross-sectional view of a semiconductor device at a fabrication stage during the manufacturing process in accordance with some embodiments of the present disclosure.

As shown in FIG. 2, an insulating liner 104 may be conformally deposited over the trench 102 and the substrate 100. The insulating liner 104 may be deposited using, for example, chemical vapor deposition (CVD) or atomic layer deposition (ALD). The insulating liner 104 may include insulating material, such as silicon oxide, silicon nitride, silicon oxynitride, dielectric material, another suitable material or a combination thereof. Next, a conductive layer 106 may be deposited over the insulating liner 104. In some embodiments, the conductive layer 106 may include doped polysilicon, a metal material, another suitable conductive material or a combination thereof.

Figure 3:
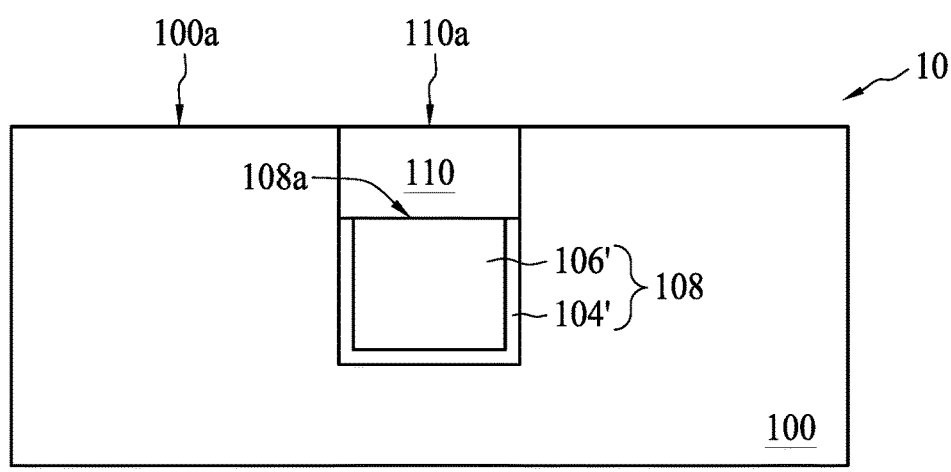
FIG. 3 illustrates a cross-sectional view of a semiconductor device at a fabrication stage during the manufacturing process in accordance with some embodiments of the present disclosure.

The conductive layer 106 and the insulating liner 104 are then etched to form the buried word line 108, as shown in FIG. 3. The etching removes the conductive layer 106 and the insulating liner 104 over the top surface 100a of the substrate 100 and a portion of the conductive layer 106 and the insulating liner 104 in the trench 102. The conductive layer 106 and the insulating liner 104 may be etched until a portion of the sidewalls of the substrate 100 is exposed. After etching, the top surfaces of the remaining conductive layer 106' and the remaining insulating liner 104' are at a same level, which is lower than the top surface 100a of the substrate 100. The remaining conductive layer 106' and the remaining insulating liner 104' form the buried word line 108. Specifically, the top surface 108a of the buried word line 108 may be disposed at a lower level than the top surface 100a of the substrate 100. In some embodiments, the buried word line 108 may extend in a first direction.

In some embodiments, a capping layer 110 may be disposed on the buried word line 108. The top surface 110a of the capping layer 110 may be disposed at the same level as the top surface 100a of the substrate 100. In some embodiments, the capping layer 110 may include an insulating material, such as silicon oxide, silicon nitride, or silicon oxynitride.

Figure 4:
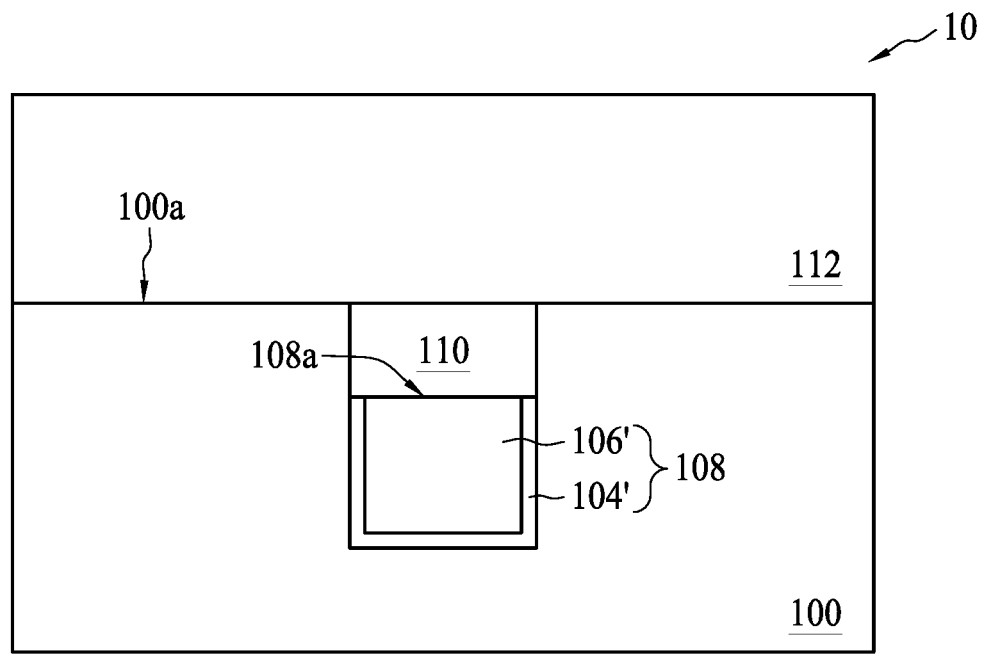
FIG. 4 illustrates a cross-sectional view of a semiconductor device at a fabrication stage during the manufacturing process in accordance with some embodiments of the present disclosure.

Referring to FIG. 10, the method 200 proceeds to step S15, in which an epitaxy silicon sheet 112 is mounted on the substrate 100 and the buried word line 108. As shown in FIG. 4, an epitaxy silicon sheet 112 may be deposited on the substrate 100 and the buried word line 108 by, for example, using an epitaxial growth method or another suitable deposition method. In some embodiments, the epitaxy silicon sheet 112 may include, but is not limited to, multilayers of Si layer and SiGe layer.

Referring to FIG. 10, the method 200 proceeds to step S17, in which a stacked nanowire structure 122 is formed in the epitaxy silicon sheet 112 and over the buried word line 108.

Figure 5:
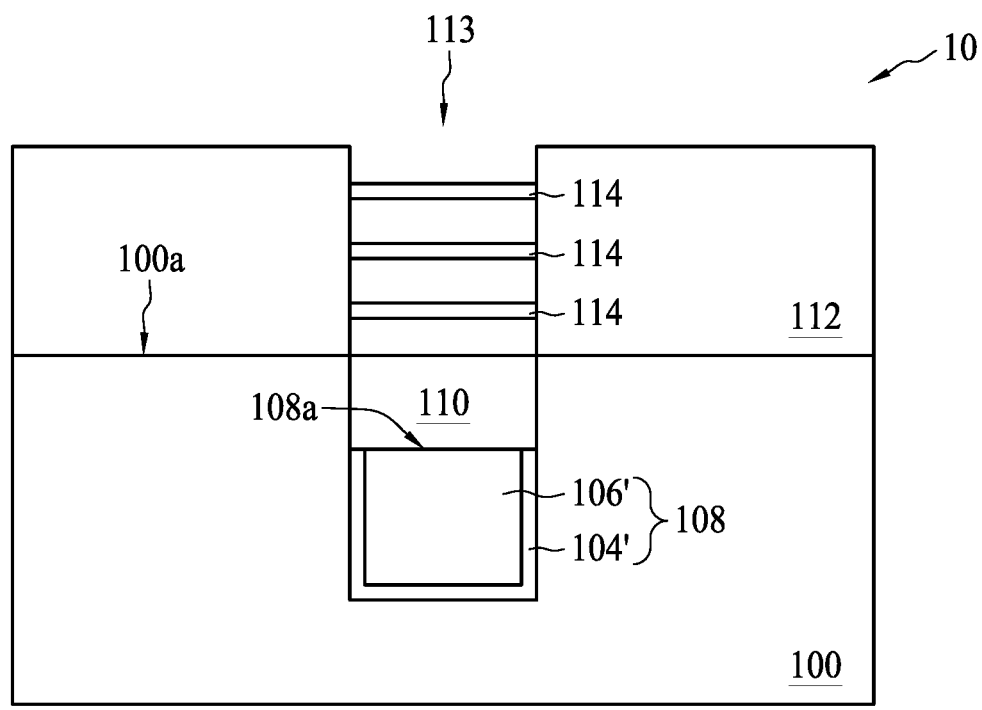
FIG. 5 illustrates a cross-sectional view of a semiconductor device at a fabrication stage during the manufacturing process in accordance with some embodiments of the present disclosure.

As shown in FIG. 5, a portion of the epitaxy silicon sheet 112 may be removed by one or more lithography patterning and etching processes. For example, a photoresist layer may be applied over the top surface of the epitaxy silicon sheet 112. The pattern may be transferred to the epitaxy silicon sheet 112 by an etch process to form a trench 113 and a plurality of suspended nanowires 114 in the trench 113. The surface of the nanowires 114 may be smoothed by performing an annealing in hydrogen. Each of the nanowires 114 thus formed may have a non-rectangular vertical cross-sectional shape. For example, in some embodiments, the nanowires 114 may have a circular or elliptical vertical cross-sectional shape. In some embodiments, an oxidation process may be performed to reduce the diameter of the nanowires 114 to desired dimensions.

Figure 6:
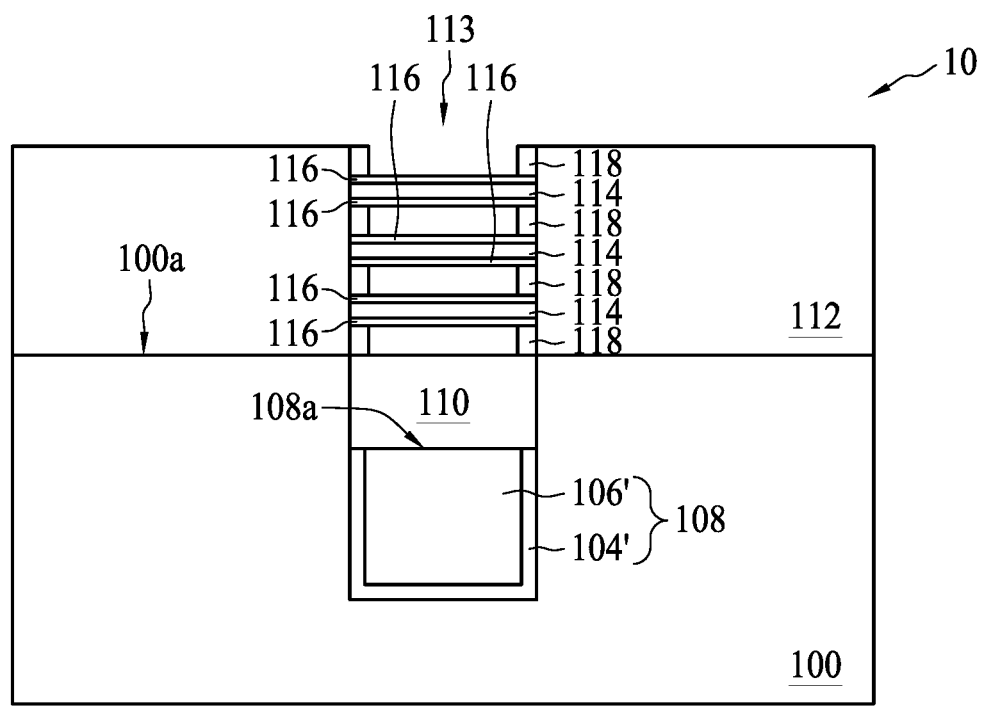
FIG. 6 illustrates a cross-sectional view of a semiconductor device at a fabrication stage during the manufacturing process in accordance with some embodiments of the present disclosure.

As shown in FIG. 6, a gate dielectric layer 116 may be formed around each of the nanowires 114. The gate dielectric layer 116 may be conformally deposited on the nanowires 114. In some embodiments, the gate dielectric layer 116 may include, for example, a high dielectric constant (high-k) dielectric material and/or a conventional gate dielectric material such as silicon oxide, silicon nitride, or silicon oxynitride. In some embodiments, the gate dielectric layer 116 may be formed by, for example, atomic layer deposition (ALD) or chemical vapor deposition (CVD). Spacer elements 118 may be formed on the sidewalls of the trench 113. In some embodiments, the spacer elements 118 may include an insulating material. For example, in some embodiments, the spacer elements 118 may include one or more of a silicon oxide layer, a silicon nitride layer, or a silicon oxynitride layer.

Figure 7:
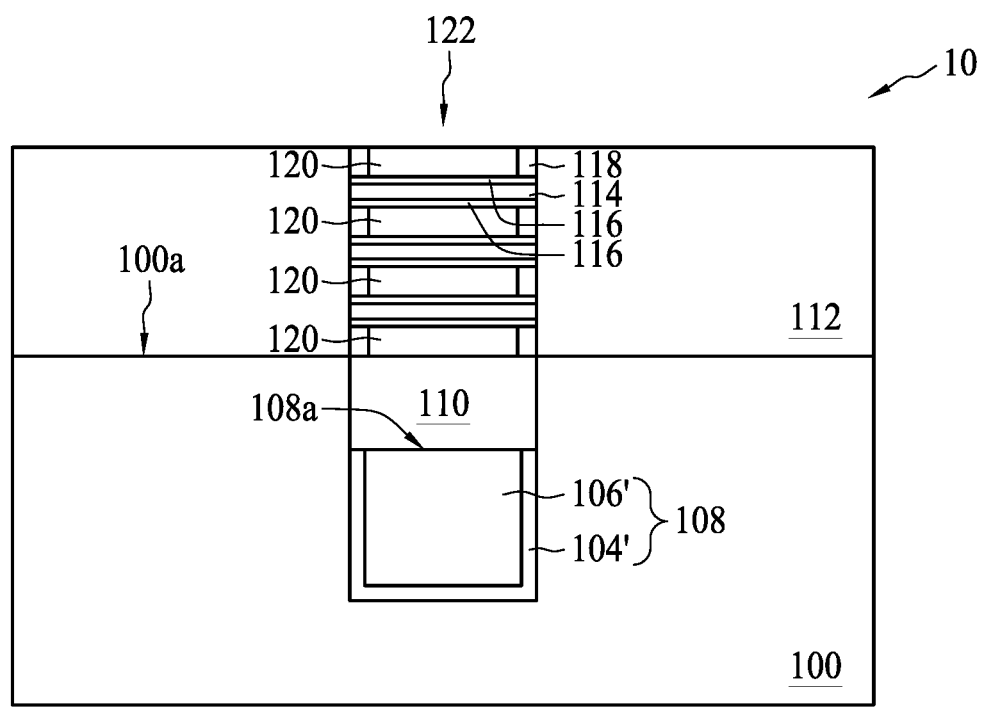
FIG. 7 illustrates a cross-sectional view of a semiconductor device at a fabrication stage during the manufacturing process in accordance with some embodiments of the present disclosure.

As shown in FIG. 7, a gate electrode material 120 may then be formed around the gate dielectric layer 116. The gate electrode material 120 fills the spaces between the different nanowires 114 and the space between the nanowires 114 and the substrate 100. In some embodiments, the gate electrode material 120 may be a conductive material such as doped semiconductor material, a metallic material, or a combination thereof. In some embodiments, the doped semiconductor material may be doped polysilicon, doped polycrystalline germanium, a doped silicon-germanium alloy, any other suitable doped elemental or compound semiconductor material, or a combination thereof. In some embodiments, the metallic material may be any metallic material that can be deposited by chemical vapor deposition (CVD), physical vapor deposition (PVD), or a combination thereof. For example, the metallic material may be aluminum and/or tungsten. As a result, a stacked nanowire structure 122 is formed. The stacked nanowire structure 122 includes a plurality of nanowires 114 alternately stacked in a direction perpendicular to the top surface 100a of the substrate 100.

Figure 8:
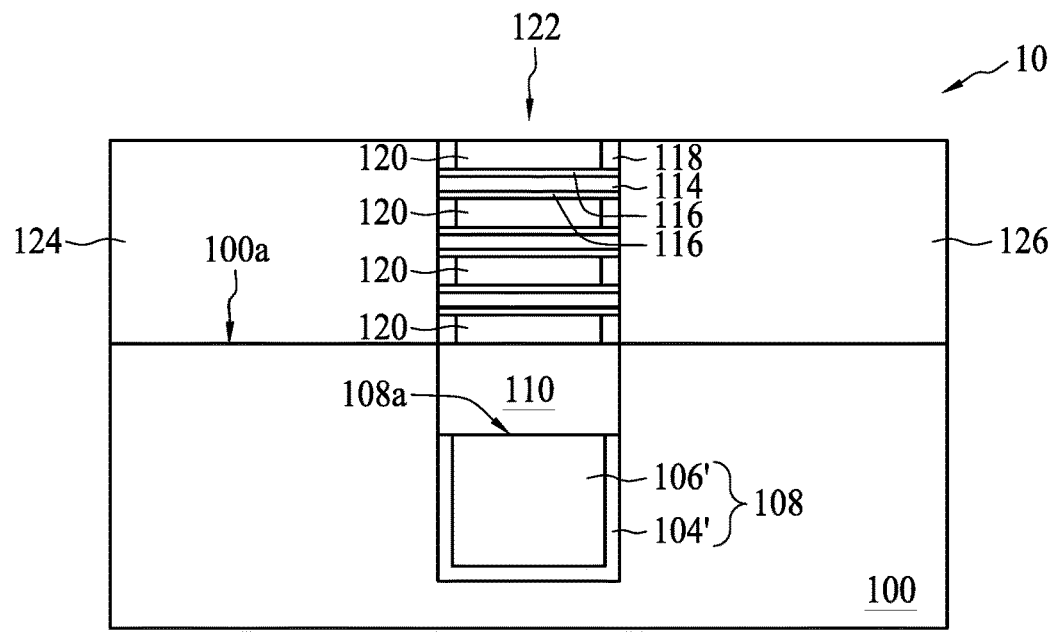
FIG. 8 illustrates a cross-sectional view of a semiconductor device at a fabrication stage during the manufacturing process in accordance with some embodiments of the present disclosure.

Referring to FIG. 10, the method 200 proceeds to step S19, in which a first source/drain region 124 and a second source/drain region 126 are formed on opposite sides of the stacked nanowire structure 122. As shown in FIG. 8, the first source/drain region 124 and the second source/drain region 126 are formed over the substrate 100.

The first source/drain region 124 and the second source/drain region 126 include dopants. In some embodiments, multiple implantation processes may be performed to dope the first source/drain region 124 and the second source/drain region 126. In some embodiments, the first source/drain region 124 and the second source/drain region 126 are doped in a subsequent process. In some embodiments, the doping is achieved using an ion implantation process, a plasma immersion ion implantation process, a gas and/or solid source diffusion process, another applicable process, or a combination thereof. In some embodiments, the first source/drain region 124 and the second source/drain region 126 may be further exposed to annealing processes to activate the dopants. For example, a rapid thermal annealing process may be performed.

In some embodiments, one of the first source/drain region 124 and the second source/drain region 126 is a p-type region, and the other of the first source/drain region 124 and the second source/drain region 126 is an n-type region.

Referring to FIG. 10, the method 200 proceeds to step S21, in which a bit line contact 130 and a capacitor contact 132 are formed over the first source/drain region 124 and the second source/drain region 126, respectively.

As shown in FIG. 9, a dielectric layer 128 may be deposited over the first source/drain region 124, the stacked nanowire structure 122, and the second source/drain region 126. Next, the bit line contact 130 and a capacitor contact 132 may be individually formed using, for example, one or more suitable lithography patterning processes, etching processes, deposition processes, or chemical mechanical planarization (CMP) processes.

In some embodiments, the bit line contact 130 and the buried word line 108 are disposed at different vertical levels. Specifically, the bottom surface 130a of the bit line contact 130 may be at a higher level than the top surface 108a of the buried word line 108. In some embodiments, a vertical distance L1 between the bit line contact 130 and the buried word line 108 may be substantially equal to or greater than the thickness T of the stacked nanowire structure 122.

In some embodiments, the buried word line 108 and the capacitor contact 132 are disposed at different vertical levels. Specifically, the bottom surface 132a of the capacitor contact 132 may be at a higher level than the top surface 108a of the buried word line 108. In some embodiments, a vertical distance L2 between the capacitor contact 132 and the buried word line 108 may be substantially equal to or greater than the thickness T of the stacked nanowire structure 122.

Therefore, the distance between the buried word line 108 and the capacitor contact (CC) 132 or the bit line contact (BC) 130 is greater than that of the semiconductor device provided in the past. The bottom surface 130a of the bit line contact 130 and the bottom surface 132a of the capacitor contact 132 are substantially disposed at the same level as the top surface 122a of the stacked nanowire structure 122.

In some embodiments, the bit line contact 130 and the capacitor contact 132 may respectively include at least one of a metal silicide, a doped polysilicon, a metal nitride, and a metal.

The bit line contact 130 and the capacitor contact 132 may be electrically connected to the first source/drain region 124 and the second source/drain region 126. One of the first source/drain region 124 and the second source/drain region 126 may be connected via the bit line contact 130 with a corresponding bit line (not shown), and the other of the first source/drain region 124 and the second source/drain region 126 may be connected via the capacitor contact 132 with a corresponding capacitor 134, as shown in FIG. 9.

Bit lines may be disposed on the bit line contact 130 and extending along a second direction. The second direction is different from the first direction along which the buried word line 108 extends. Each of the bit lines may be electrically connected to the bit line contacts 130 arranged in the second direction. In some embodiments, the bit lines may include conductive material. For example, the conductive material of the bit lines may be polysilicon. The semiconductor 10 further includes a capacitor 134 electrically connected to the capacitor contact 132. The capacitor 134 may be formed in accordance with the general process of the dynamic random access memory (DRAM). Since the process of capacitors is a conventional technique, it is not described here.

The semiconductor device 10 obtained by the method provided by the embodiments of the present disclosure has the following advantages. Compared to the semiconductor device provided in the past, since the buried word line 108 and the capacitor contact (CC) 132 or bit line contact (BC) 130 are disposed at different vertical levels, the semiconductor device 10 provided by the embodiments of the present disclosure can reduce the parasitic capacitance by increasing the distance between the buried word line 108 and the CC 132 or BC 130. Therefore, the performance of the semiconductor device 10 in the embodiments of the present disclosure is improved.

In accordance with some embodiments, a semiconductor device is provided. The semiconductor device includes a substrate. The semiconductor device also includes a buried word line disposed in the substrate and extending along a first direction. The semiconductor device further includes a stacked nanowire structure disposed over the buried word line. In addition, the semiconductor device includes a first source/drain region and a second source/drain region disposed on opposite sides of the stacked nanowire structure. Furthermore, the semiconductor device includes a bit line contact and a capacitor contact disposed over the first source/drain region and the second source/drain region, respectively.

In accordance with some embodiments, a method for manufacturing a semiconductor device is provided. The method includes providing a substrate. The method also includes forming a buried word line extending along a first direction in the substrate. The method further includes mounting an epitaxy silicon sheet on the substrate and the buried word line. In addition, the method includes forming a stacked nanowire structure in the epitaxy silicon sheet and over the buried word line. Furthermore, the method includes forming a first source/drain region and a second source/drain region on opposite sides of the stacked nanowire structure, and forming a bit line contact and a capacitor contact over the first source/drain region and the second source/drain region, respectively.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a substrate;
    a buried word line, disposed in the substrate and extending along a first direction;
    a stacked nanowire structure, disposed over the buried word line;
    a first source/drain region and a second source/drain region, disposed on opposite sides of the stacked nanowire structure; and
    a bit line contact and a capacitor contact, disposed over the first source/drain region and the second source/drain region, respectively.

2. The semiconductor device of claim 1, wherein the buried word line comprises an insulating liner and a conductive layer.

3. The semiconductor device of claim 1, wherein a vertical distance between the bit line contact and the buried word line is substantially equal to or greater than a thickness of the stacked nanowire structure.

4. The semiconductor device of claim 1, wherein a bottom surface of the bit line contact is at a higher level than a top surface of the buried word line.

5. The semiconductor device of claim 1, wherein a vertical distance between the capacitor contact and the buried word line is substantially equal to or greater than a thickness of the stacked nanowire structure.

6. The semiconductor device of claim 1, wherein a bottom surface of the capacitor contact is disposed at a higher level than a top surface of the buried word line.

7. The semiconductor device of claim 1, further comprising a bit line, disposed on the bit line contact and extending along a second direction, wherein the second direction is different from the first direction.

8. The semiconductor device of claim 1, further comprising a capacitor electrically connected to the capacitor contact.

9. The semiconductor device of claim 1, wherein the stacked nanowire structure comprises a plurality of nanowires alternately stacked in a direction perpendicular to a top surface of the substrate.

10. The semiconductor device of claim 9, further comprising:
    a gate dielectric layer around each of the plurality of nanowires; and
    a gate electrode material around the gate dielectric layer.

11. A method for manufacturing a semiconductor device, comprising:
    providing a substrate;
    forming a buried word line extending along a first direction in the substrate;
    mounting an epitaxy silicon sheet on the substrate and the buried word line;
    forming a stacked nanowire structure in the epitaxy silicon sheet and over the buried word line;
    forming a first source/drain region and a second source/drain region on opposite sides of the stacked nanowire structure; and
    forming a bit line contact and a capacitor contact over the first source/drain region and the second source/drain region, respectively.

12. The method for manufacturing a semiconductor device of claim 11, wherein forming the buried word line extending along the first direction in the substrate comprises:
    forming an insulating liner over a trench in the substrate;
    forming a conductive layer over the insulating liner; and
    etching the insulating and the conductive layer until a portion of the sidewalls of the trench is exposed.

13. The method for manufacturing a semiconductor device of claim 11, wherein a vertical distance between the bit line contact and the buried word line is substantially equal to or greater than a thickness of the stacked nanowire structure.

14. The method for manufacturing a semiconductor device of claim 11, wherein forming the bit line contact and the capacitor contact over the first source/drain region and the second source/drain region comprises:
    forming the bit line contact with a bottom surface at a higher level than a top surface of the buried word line.

15. The method for manufacturing a semiconductor device of claim 11, wherein a vertical distance between the capacitor contact and the buried word line is substantially equal to or greater than a thickness of the stacked nanowire structure.

16. The method for manufacturing a semiconductor device of claim 11, wherein forming the bit line contact and the capacitor contact over the first source/drain region and the second source/drain region comprises:
    forming the capacitor contact with a bottom surface at a higher level than a top surface of the buried word line.

17. The method for manufacturing a semiconductor device of claim 11, further comprising:
    forming a bit line extending along a second direction on the bit line contact, wherein the second direction is different from the first direction.

18. The method for manufacturing a semiconductor device of claim 11, further comprising:
    forming a capacitor electrically connected to the capacitor contact.

19. The method for manufacturing a semiconductor device of claim 11, wherein forming the stacked nanowire structure in the epitaxy silicon sheet and over the buried word line comprises:
    forming a plurality of nanowires alternately stacked in a direction perpendicular to a top surface of the substrate.

20. The method for manufacturing a semiconductor device of claim 19, wherein the method, after forming a stacked nanowire structure in the epitaxy silicon sheet and over the buried word line, further comprises:
    forming a gate dielectric layer around each of the plurality of nanowires; and
    forming a gate electrode material around the gate dielectric layer.

* * * * *